(12) United States Patent
Enomoto et al.

(10) Patent No.: US 8,558,947 B2
(45) Date of Patent: Oct. 15, 2013

(54) SOLID-STATE IMAGE PICKUP ELEMENT, A METHOD OF MANUFACTURING THE SAME AND ELECTRONIC APPARATUS USING THE SAME

(75) Inventors: Takayuki Enomoto, Kanagawa (JP); Keiichi Nakazawa, Kumamoto (JP)

(73) Assignee: Sony Corporation, Tokyo (JP)

( * ) Notice: Subject to any disclaimer, the term of this patent is extended or adjusted under 35 U.S.C. 154(b) by 367 days.

(21) Appl. No.: 12/700,550

(22) Filed: Feb. 4, 2010

(65) Prior Publication Data

US 2010/0225774 A1 Sep. 9, 2010

(30) Foreign Application Priority Data

Mar. 6, 2009 (JP) ................................ 2009-054212

(51) Int. Cl.
*H04N 5/225* (2006.01)
(52) U.S. Cl.
USPC .......................................... 348/374; 257/414
(58) Field of Classification Search
USPC ........................................................ 348/374
See application file for complete search history.

(56) References Cited

U.S. PATENT DOCUMENTS

| 6,171,976 | B1 | 1/2001 | Cheng | |
|---|---|---|---|---|
| 7,803,653 | B2 * | 9/2010 | Yoo et al. | 438/71 |
| 7,816,749 | B2 * | 10/2010 | Omi et al. | 257/431 |
| 7,825,494 | B2 * | 11/2010 | Jun | 257/620 |
| 2006/0094151 | A1 | 5/2006 | Sumi | |
| 2007/0063317 | A1 * | 3/2007 | Kim et al. | 257/622 |

FOREIGN PATENT DOCUMENTS

| JP | 04-037020 | 2/1992 |
|---|---|---|
| JP | 04-111307 | 4/1992 |
| JP | 06-283702 | 10/1994 |
| JP | 2005-302985 | 10/2005 |
| JP | 2006-128392 | 5/2006 |
| JP | 2008-182142 | 8/2008 |

OTHER PUBLICATIONS

Olivier, "Chemical, Mechanical Planarization of Semiconductor Materials", 2004, Springer, XP002584380, ISBN: 3540431810, Chapter 9.3.5 "Minimizing Pattern Density Effects" pp. 332-326.

* cited by examiner

*Primary Examiner* — Anthony J Daniels
(74) *Attorney, Agent, or Firm* — Robert J. Depke; The Chicago Technology Law Group, LLC

(57) ABSTRACT

Disclosed herein is a solid-state image pickup element, including a plurality of pixels each having a photoelectric conversion portion for converting a quantity of incident light into an electric signal, and a plurality of pixel transistors; wiring layers formed on one surface side of a semiconductor substrate having the plurality of pixels formed therein, a light made incident from a side opposite to the one surface having the wiring layers formed thereon being received by corresponding one of the photoelectric conversion portions; a scribe line formed in a periphery of a pixel portion composed of the plurality of pixels; and square-shaped termination detecting portions each having higher hardness than that of the semiconductor substrate and formed in the scribe line; wherein each of the square-shaped termination detecting portions has a side parallel with a direction of the scribe line of the semiconductor substrate.

10 Claims, 9 Drawing Sheets

SOLID-STATE IMAGE PICKUP ELEMENT, A METHOD OF MANUFACTURING THE SAME AND ELECTRONIC APPARATUS USING THE SAME

The present application claims priority to Japanese Patent Application No. 2009-054212 filed in the Japan Patent Office on Mar. 6, 2009, the entire content of which is hereby incorporated by reference.

BACKGROUND OF THE INVENTION

1. Field of the Invention

The present invention relates to a MOS type solid-state image pickup element, a method of manufacturing the same, and an electronic apparatus using the same.

2. Description of the Related Art

A CMOS type solid-state image pickup element having a surface radiation type structure is shown as an example of a current solid-state image pickup element in FIG. 7. In a surface radiation type solid-state image pickup element 201, signal processing portions 229 and a wiring layer 223 are formed in an upper layer relative to a photoelectric conversion portion (composed of photodiodes: PDs) 222. The wiring layer 223 is structured by laminating wirings 224 and insulating layers 225. In addition, a color filter 227 and an on-chip lens 228 are formed in this order on the wiring layer 223. Thus, a light condensed by the on-chip lens 228 is made incident from the wiring layer 223 side to the photoelectric conversion portion 222. The surface radiation type solid-state image pickup element 201 has the structure as described above.

However, an interval between adjacent two wirings 224 becomes narrow with the progress of miniaturization of the solid-state image pickup element. In addition, along with the progress of the multi-layer interconnection of the wiring layer 223, a distance between the on-chip lens 228 and the photoelectric conversion portion 222 becomes wider, so that a part Lx of a light L made obliquely incident hardly reaches the photoelectric conversion portion 222. For this reason, a phenomenon is generated in which light receiving characteristics such as shading are deteriorated.

A back surface radiation type solid-state image pickup element as shown in FIG. 8 is proposed as a structure useful in improving the deterioration of the light receiving characteristics. This back surface radiation type solid-state image pickup element, for example, is described in Japanese Patent Laid-Open No. Hei 6-283702. In the back surface radiation type solid-state image pickup element 101, signal processing portions 129, and a wiring layer 123 composed of wirings 124 and an insulating layer 125 are formed in a lower portion relative to a photoelectric conversion layer 122. In addition, a color filter 127 and an on-chip lens 128 are wired and disposed in this order on the photoelectric conversion portion 122. The back surface radiation type solid-state image pickup element 101 has a structure that the wiring layer 123 is not formed between the photoelectric conversion portion 122, and each of the color filter 127 and the on-chip lens 128 in such a manner. With this structure, an effective aperture ratio of 100% for an oblique light L can be attained. Thus, the sensitivity can be largely increased, and the generation of the shading can also be suppressed.

Then, a normal semiconductor substrate has a thickness which is as thick as several hundreds of micron meters, and thus may not transmit a light. For this reason, in the back surface radiation type CMOS solid-state image pickup element described above, a silicon substrate, for example, needs to be processed thinly to have a thickness of 10 μm or less because the light is radiated from the back surface of the silicon substrate. When the silicon substrate is processed thinly, if the thickness of the silicon layer disperses, the dispersion occurs in the incidence intensity of the light, and thus the nonconformity occurs in the form of the color shading.

On the other hand, for the purpose of preventing the thickness of the silicon layer from dispersing, a method using a Silicon On Insulator (SOI) substrate is devised. With this method, mechanical polishing having a high etching rate is carried out for the SOI substrate, Chemical Mechanical Polishing (CMP) processing is subsequently carried out, wet etching is then carried out, and the processing is stopped by an $SiO_2$ layer, thereby preventing the thickness of the silicon layer from dispersing.

However, since the SOI substrate is more expensive than the normal semiconductor substrate, an increase in manufacture cost of the solid-state image pickup element due to use of the expensive SOI substrate becomes a problem.

Then, there is proposed a method of manufacturing a back surface radiation type solid-state image pickup element without using the SOI substrate for the purpose of reducing the substrate cost in the manufacture of the solid-state image pickup element. For example, there is proposed a method of providing a termination detecting portion having higher hardness than that of a substrate on a scribe line or in either a part of or the periphery of a pixel portion composed of a plurality of pixels, thereby manufacturing a back surface radiation type solid-state image pickup element. This method, for example, is described in Japanese Patent Laid-Open Nos. 2006-128392 and 2008-182142. With this method, when the semiconductor substrate is thinly processed from one surface side thereof by carrying out the CMP processing, the chemical mechanical polishing can be ended in the termination detecting portion in a self-aligned manner.

SUMMARY OF THE INVENTION

For ending the chemical mechanical polishing by the CMP processing in the self-aligned manner in the method using the termination detecting portion described above, a sufficiently large area is necessary for the termination detecting portion.

However, when the termination detecting portion is provided in either the part of or the periphery of the pixel portion composed of a plurality of pixels, increasing the area of the termination detecting portion results in the reduction of a region in which photodiodes are to be formed, and a region in which a plurality of MOS transistors composing the pixels are to be formed in the pixel portion. On the other hand, when the area of the termination detecting portion is reduced, it becomes difficult to stop the chemical mechanical polishing by the CMP processing in the self-aligned manner. In addition, by forming the termination detecting portion, the irregularities are caused on the surface of the semiconductor substrate. For this reason, it becomes difficult to planarize the interlayer insulating layer.

In addition, in the case of the back surface radiation type solid-state image pickup element, the semiconductor substrate is thinly shaved by the CMP processing or the like. For this reason, when the termination detecting portion having the higher hardness than that of the semiconductor substrate is formed either on the scribe line or in the periphery of the pixel portion, a crack or the like is generated in the semiconductor substrate in cutting the semiconductor substrate into pieces of solid-state image pickup elements.

As has been described, the provision of the termination detecting portion results in that the regions in which the photoelectric conversion portions and the transistors are to be formed in the pixel portion are reduced and moreover the manufacture yield is reduced owing to the generation of the irregularities in the interlayer insulating layer, and the crack or the like in the semiconductor substrate.

The present invention has been made in order to solve the problems described above, and it is therefore desirable to provide a back surface radiation type solid-state image pickup element in which a sufficient area can be ensured in a pixel portion and a yield can be increased, a method of manufacturing the same, and an electronic apparatus using the same.

In order to attain the desire described above, according to an embodiment of the present invention, there is provided a solid-state image pickup element including: a plurality of pixels each having a photoelectric conversion portion for converting a quantity of incident light into an electric signal, and a plurality of pixel transistors; wiring layers formed on one surface side of a semiconductor substrate having the plurality of pixels formed therein, a light made incident from a side opposite to the one surface having the wiring layers formed thereon being received by corresponding one of the photoelectric conversion portions; a scribe line formed in a periphery of a pixel portion composed of the plurality of pixels; and square-shaped termination detecting portions each having higher hardness than that of the semiconductor substrate and formed in the scribe line; in which each of the square-shaped termination detecting portions has a side parallel with a direction of the scribe line of the semiconductor substrate.

According to another embodiment of the present invention, there is provided a method of manufacturing a solid-state image pickup element including the steps of: forming square-shaped termination detecting portions each having higher hardness than that of a semiconductor substrate and having a side parallel with a direction of a scribe line of the semiconductor substrate in a thickness direction from one surface of the semiconductor substrate in the scribe line of the semiconductor substrate; forming a part of constituent elements of the solid-state image pickup element on the one surface side of the semiconductor substrate; sticking a supporting substrate onto the one surface side of the semiconductor substrate; carrying out chemical mechanical polishing for the other surface side of the semiconductor substrate, and stopping the chemical mechanical polishing in a position where each of bottom surfaces of the termination detecting portions is exposed to the other surface side of the semiconductor substrate in a self-aligned manner, thereby thinly processing the semiconductor substrate; and forming the other part of the constituent elements of the solid-state image pickup element on the other surface side of the semiconductor substrate.

According to still another embodiment of the present invention, there is provided an electronic apparatus including: a solid-state image pickup element including: a plurality of pixels each having a photoelectric conversion portion for converting a quantity of incident light into an electric signal, and a plurality of pixel transistors; wiring layers formed on one surface side of a semiconductor substrate having the plurality of pixels formed therein, a light made incident from a side opposite to the one surface having the wiring layers formed thereon being received by corresponding one of the photoelectric conversion portions; a scribe line formed in a periphery of a pixel portion composed of the plurality of pixels; and square-shaped termination detecting portions each having higher hardness than that of the semiconductor substrate and formed in the scribe line, each of the square-shaped termination detecting portions having a side parallel with a direction of the scribe line of the semiconductor substrate; an optical system for guiding the incident light to an image pickup portion of the solid-state image pickup element; and a signal processing circuit for processing an output signal from the solid-state image pickup element.

In the solid-state image pickup element of the embodiment of the present invention, and the method of manufacturing the same of the another embodiment of the present invention described above, the square-shaped termination detecting portions are formed in the scribe line. Each of the termination detecting portions has higher hardness than that of the semiconductor substrate, and is formed so as to have the square shape having the side parallel with the direction of the scribe line of the semiconductor substrate.

The formation of the termination detecting portions results in that while the one surface side of the semiconductor substrate is removed, the removal processing is stopped in the position where each of the bottom surfaces of the termination detecting portions is exposed in the self-aligned manner. In addition, the termination detecting portions are formed on the scribe line, which does not exert an influence on an area of the regions or the like in which the pixel portion and the transistors of the solid-state image pickup element are to be formed. Also, each of the termination detecting portions is formed so as to have the structure described above, whereby it is possible to suppress the reduction of the manufacture yield owing to generation of a crack or the like of the semiconductor substrate thinly processed in cutting the semiconductor substrate into the pieces of solid-state image pickup elements.

In addition, according to the electronic apparatus of the still another embodiment of the present invention, by providing the electronic apparatus with the solid-state image pickup element of the embodiment of the present invention described above, the electronic apparatus can be manufactured in the high manufacture yield and at the low cost.

As set forth hereinabove, according to the embodiments of the present invention, it is possible to provide the back surface radiation type solid-state image pickup element in which the sufficient area can be ensured in the pixel portion and the manufacture yield can be increased, the method of manufacturing the same, and the electronic apparatus using the same.

DETAILED DESCRIPTION OF THE PREFERRED EMBODIMENTS

Although preferred embodiments of the present invention will be described in detail hereinafter with reference to the accompanying drawings, the present invention is by no means limited thereto. It is noted that the description will be given in accordance with the following order.

1. Solid-State Image Pickup Element
2. Method of Manufacturing Solid-State Image Pickup Element
3. Electronic Apparatus 1. Solid-State Image Pickup Element
Structure of Solid-State Image Pickup Element Hereinafter, a description will be given with respect to a solid-state image pickup element according to an embodiment of the present invention.

Figure 1A:
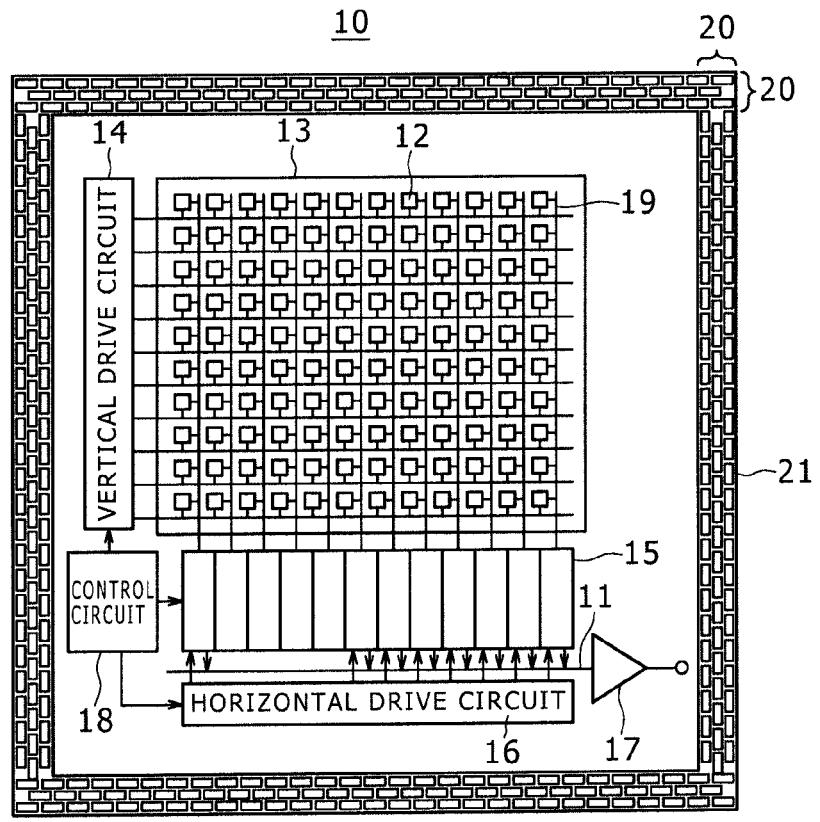
FIGS. 1A and 1B are respectively top plan views each showing a MOS type solid-state image pickup element according to an embodiment of the present invention.
Figure 1B:
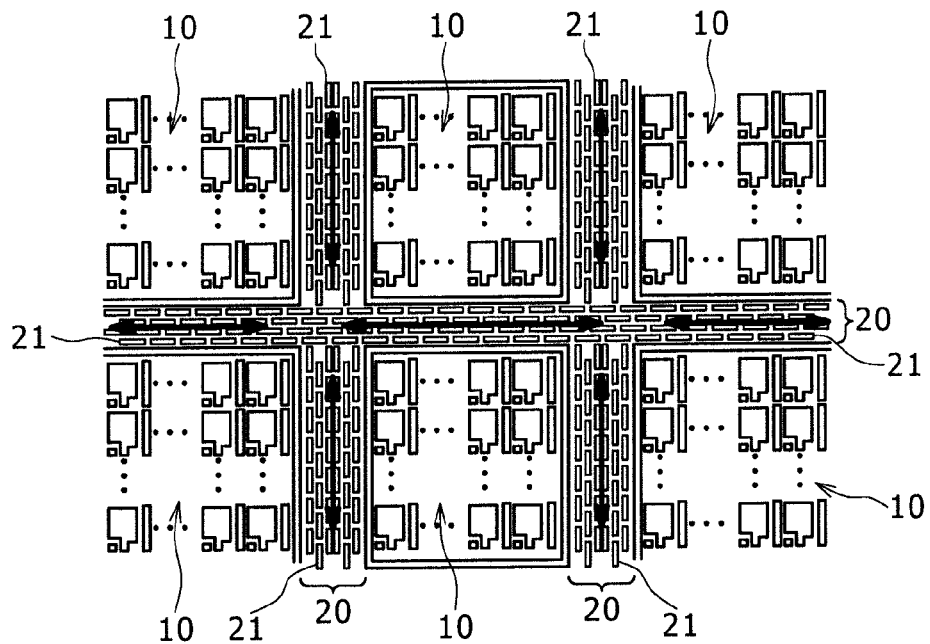

FIGS. 1A and 1B respectively show schematic structures of a MOS type solid-state image pickup element as the solid-state image pickup element according to the embodiment of the present invention.

The MOS type solid-state image pickup element 10 is composed of a pixel portion (so-called image pickup region) 13 in which pixels 12 including photodiodes becoming a plurality of photoelectric conversion portions are regularly, two-dimensionally arranged on a semiconductor substrate, e.g., a silicon substrate, and a peripheral circuit portion. Each of the pixels 12 has the photodiode and a plurality of pixel transistors (so-called MOS transistors).

In addition, each of termination detecting portions 21 at which removal processing is stopped while one surface side of the semiconductor substrate is removed in the periphery of the pixel portion 13 composed of a plurality of pixels 12 of the MOS type solid-state image pickup element 10. The termination detecting portions 21, as shown in FIG. 1B, are formed between each adjacent two pixel portion 13 each composed of a plurality of pixels 12 of a plurality of solid-state image pickup elements 10 formed on the semiconductor substrate. The periphery of the pixel portion 13 composed of a plurality of pixels 12 of the solid-state image pickup element 10 means a region at which the semiconductor substrate is cut in scribe processing or the like, i.e., so-called a scribe line 20, in cutting the semiconductor substrate into pieces of the MOS type solid-state image pickup elements 10.

In other words, each of the termination detecting portions 21 is formed so as to have a square shape in the scribe line 20 in the periphery of the MOS type solid-state image pickup element 10. In FIGS. 1A and 1B, each of the square-shaped termination detecting portions 21 is shown in the form of rectangular one in which a longitudinal direction thereof is defined in the same direction as that of the scribe line of the semiconductor substrate. It should be noted that the shape of the termination detecting portion 21 is by no means limited to the rectangular shape shown in FIGS. 1A and 1B, and the termination detecting portion 21 may have any other suitable shape as long as the termination detecting portion 21 has the square shape having a side parallel with the direction of the scribe line 20. For example, the termination detecting portion 21 may have a shape such as a rectangular shape in which a longitudinal direction thereof is defined in the direction crossing at right angles with the direction of the scribe line 20 of the semiconductor substrate, or a quadrate having a side parallel with the direction of the scribe line 20.

A plurality of pixel transistors, for example, can be composed of three transistors of a transfer transistor, a reset transistor, and an amplification transistor. In addition thereto, a plurality of pixel transistors may be composed of four transistors having an additional selection transistor.

The peripheral circuit portion is composed of a vertical drive circuit 14, a column signal processing circuit 15, a horizontal drive circuit 16, an output circuit 17, a control circuit 18, and the like.

The control circuit 18 generates a clock signal and control signals becoming references for operations of the vertical drive circuit 14, the column signal processing circuit 15, the horizontal drive circuit 16, and the like, based on a vertical synchronizing signal, a horizontal synchronizing signal and a master clock. The control circuit 18 inputs the clock signal and the control signals to the vertical drive circuit 14, the column signal processing circuit 15, the horizontal drive circuit 16, and the like.

The vertical drive circuit 14, for example, is composed of a shift register. The vertical drive circuit 14 successively selection-scans the pixels 12 of the pixel portion 13 in rows in a vertical direction, and supplies pixel signals based on signal charges generated in accordance with quantities of received lights in the photoelectric conversion elements of the respective pixels 12 to the column signal processing circuit 15 through vertical signal lines 19.

The column signal processing circuit 15, for example, is disposed every column of the pixels 12, and carries out signal processing such as noise removal, in accordance with signals from black reference pixels (formed in the periphery of an effective pixel region), for signals outputted from the pixels 12 for one row every pixel column. That is to say, the column signal processing circuit 15 carries out the signal processing such as Correlated Double Sampling (CDS) for removing fixed pattern noises peculiar to the pixels 12, and signal amplification. A horizontal selection switch (not shown) is provided in an output stage of the column signal processing circuit 15 so as to be connected between the output stage and the horizontal signal line 11.

The horizontal drive circuit 16, for example, is composed of a shift register. The horizontal drive circuit 16 selects the column signal processing circuits 15 in order by successively outputting horizontal scanning pulses, and outputs the pixel signals from the respective column signal processing circuits 15 to the horizontal signal line 11.

The output circuit 17 carries out signal processing for the signals which are successively supplied from the respective column signal processing circuits 15 through the horizontal signal line 11, and then outputs the resulting signals.

When the MOS type solid-state image pickup element 10 is applied to a back surface radiation type solid-state image pickup element, a plurality of wiring layers are not formed on a back surface on a light incidence surface (so-called light receiving surface) side, but are formed on a front surface side opposite to the light receiving surface.

Structure in Cross Sectional View of Solid-State Image Pickup Element

Figure 2:
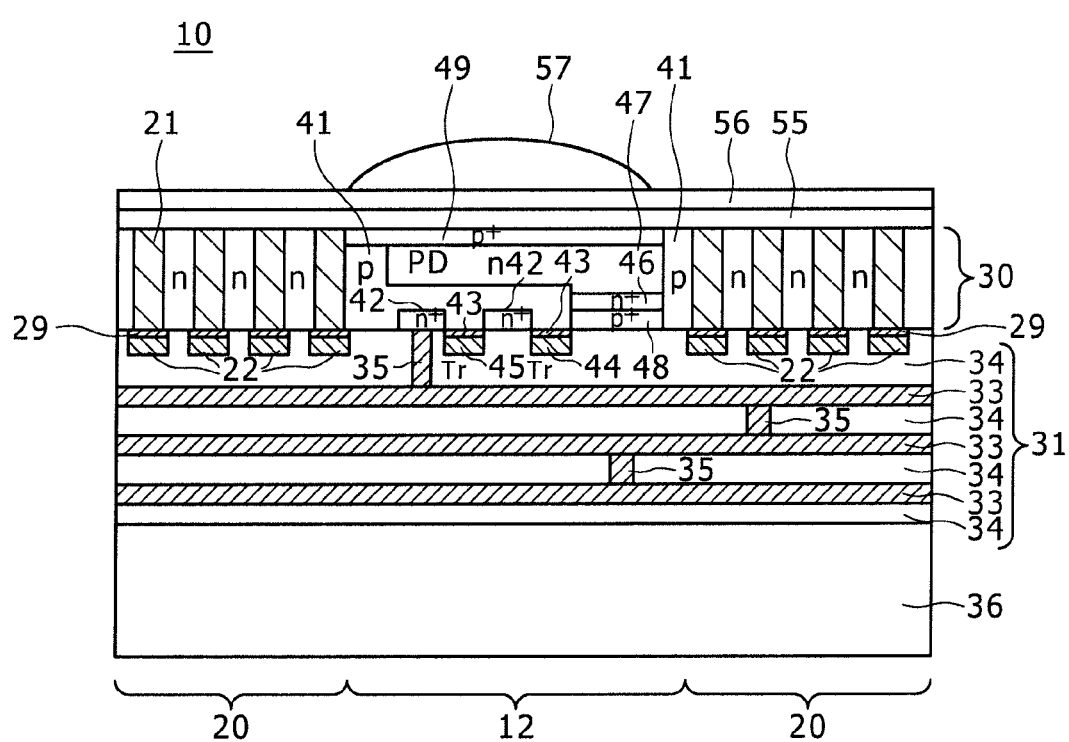
FIG. 2 is a cross sectional view explaining a structure of the MOS type solid-state image pickup element shown in FIG. 1A.

FIG. 2 shows a cross sectional view of the MOS type solid-state image pickup element 10 described above. It is noted that in FIG. 2, a structure of the termination detecting portion 21 in the scribe line 20 is shown as an example of a unit pixel composed of a photodiode PD and a plurality of MOS transistors Tr of the MOS type solid-state image pickup element 10.

It is noted that in FIG. 2, a standpoint is reverse from that in FIG. 4, and FIGS. 5A to 5F.

Each of the termination detecting portions 21 is formed in the scribe line 20 of a semiconductor substrate 30. Also, each of the termination detecting portions 21 is formed at the same depth (a depth from the substrate surface) as that of the photodiode PD serving as the photoelectric conversion element within the semiconductor substrate 30.

The pixel 12 is provided with a plurality of MOS transistors Tr for reading out the signal charges from the photodiode PD. A plurality of MOS transistors Tr are formed on the surface of the semiconductor substrate 30.

A plurality of MOS transistors Tr are composed of various kinds of transistors. For example, as described above, a plurality of MOS transistors Tr are composed of the four transistors of the transfer transistor, the reset transistor, the amplification transistor, and the selection transistor added thereto.

With a plurality of MOS transistors Tr, a charge reading transistor is formed by the photodiode PD, a pair of source and drain regions 42, and a gate electrode 44 between the source and drain regions 42 in the pair. Also, the other transistor is formed by the other pair of source and drain regions 42, and a gate electrode 45 between the source and drain regions 42 in the other pair.

In addition, a multi-layer interconnection layer 31 composed of wiring layers 33 and insulating layers 34 is provided on the side of, formation of the semiconductor substrate 30, having the MOS transistors Tr formed thereon.

In a predetermined region of the photodiode PD and the MOS transistors Tr, for example, in a position corresponding to the source and drain regions, the gate electrode and the like, a contact plug 35 for connection to corresponding one of the wiring layers 33 is provided so as to extend completely through corresponding one of the insulating layers 34.

In addition, gate electrodes 22 each similar in structure to that of the MOS transistor Tr are formed on the surface side as well, of the semiconductor substrate 30, of the termination detecting portion 21. Each of those gate electrodes 22 is not used as the electrode of the normal semiconductor device, and thus becomes a dummy electrode not connected to any of the wirings or the like.

In addition, a bottom portion of each of the gate electrodes 22 is formed so as to have a larger area than that of each of the termination detecting portions 21. When the termination detecting portion 21 is formed so as to be buried in the semiconductor substrate 30, a stepped portion is readily generated between the termination detecting portion 21 and the semiconductor substrate 30. This stepped portion exerts an influence on the flatness of the insulating layers 34 and the wiring layer 33 in the multi-layer interconnection layer 31 of the MOS type solid-state image pickup element 10, and thus causes the disconnection and short-circuit of the wiring layers.

For this reason, the gate electrode 22 having the larger area than that of the termination detecting portion 21 is formed on the termination detecting portion 21, whereby the stepped portion generated between the termination detecting portion 21 and the semiconductor substrate 30 is covered with the gate electrode 22 to be buried under the gate electrode 22. The gate electrode 22 having the larger area than that of the termination detecting portion 21 is provided on the termination detecting portion 21 in such a manner, whereby the disconnection and short-circuit of the wiring layers 33 caused by the stepped portion between the semiconductor substrate 30 and the termination detecting portion 21 is suppressed, thereby enhancing the reliability of the MOS type solid-state image pickup element 10.

In addition, the photodiode PD is formed in the semiconductor substrate 30 through an ion implantation process. The photodiode PD is formed at the same depth as that of the termination detecting portion 21.

For the photodiode PD, for example, a p-type well region 41 composed of a semiconductor region of a first conductivity type is formed in the (n-type) semiconductor substrate 30 of a second conductivity type. Moreover, a plurality of MOS transistors Tr composed of the source and drain regions 42 each composed of a ($n^+$-type) semiconductor region of the second conductivity type having a higher impurity concentration than that of the p-type well region 41, the gate insulating film 43, and the gate electrodes 44 are formed on the semiconductor substrate 30. Also, a (n-type) semiconductor region 46 of the second conductivity type is formed between both the principal surfaces of the semiconductor substrate 30 so as to extend up to the p-type well region 41 having a plurality of MOS transistors Tr formed therein, thereby structuring the photodiode PD. A ($n^+$-type) charge accumulation region 48 of the second conductivity type having a high impurity concentration is formed on the (n-type) semiconductor region 46 of the second conductivity type. Also, an accumulation layer 49 composed of a ($p^+$-type) semiconductor region of the first conductivity type having the high impurity concentration and serving to suppress generation of a dark current is formed so as to contact the ($n^+$-type) charge accumulation region 48 of the second conductivity type. In addition, the accumulation layer 49 composed of a ($p^+$-type) semiconductor region of the first conductivity type having the high impurity concentration and serving to suppress the generation of the dark current is formed on the light incidence surface side of the photodiode PD.

In addition, a passivation layer 55 for protecting the surface of the semiconductor substrate 30 is formed on the photodiode PD and the termination detecting portions 21 of the semiconductor substrate 30. Moreover, a color filter 56 and an on-chip lens 57 are provided in this order on the passivation layer 55.

A supporting substrate 36 is stuck to a surface of the multi-layer interconnection layer 31 opposite to one surface of the multi-layer interconnection layer 31 contacting the semiconductor substrate 30. As has been described, the multi-layer interconnection layer 31 and the semiconductor substrate 30 are provided in this order on the supporting substrate 36, thereby structuring the back surface radiation type solid-state image pickup element 10.

Structure of Termination Detecting Portion

Figure 3A:
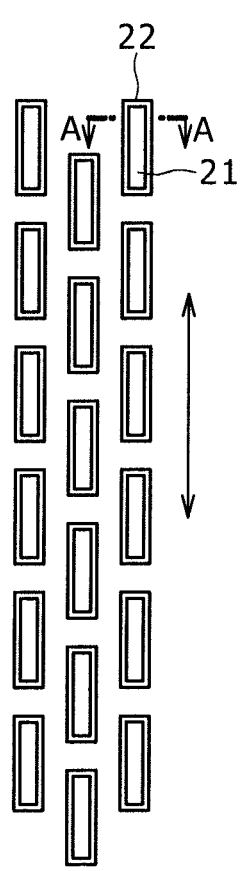
FIGS. 3A to 3C are respectively schematic top plan views explaining respective arrangements of termination detecting portions shown in FIGS. 1A and 1B, and FIG. 2.
Figure 3B:
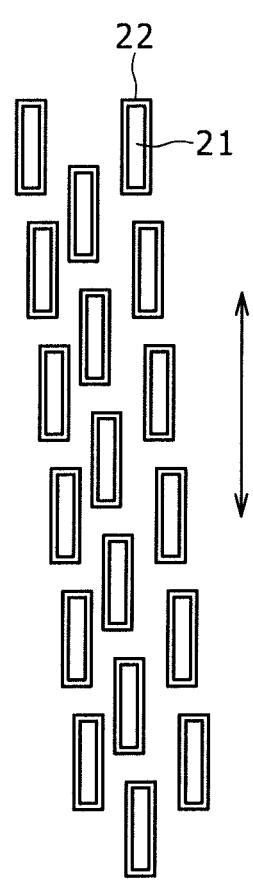
Figure 3C:
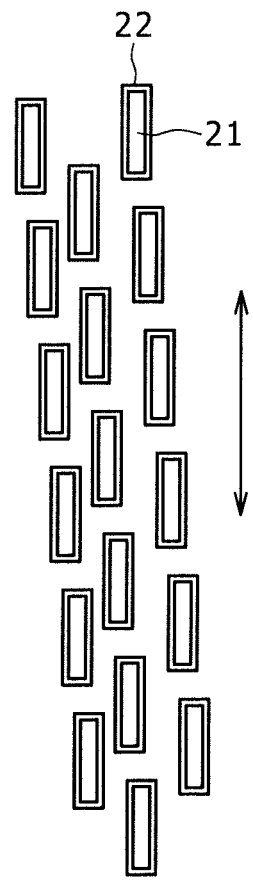

Next, a description will be given with respect to structures of the termination detecting portion 21 described above, and the gate electrode 22 formed on the termination detecting portion 21. FIGS. 3A, 3B and 3C are respectively enlarged planar views of the termination detecting portion 21 and the gate electrode 22.

In each of FIGS. 3A, 3B and 3C, an inner line of a rectangle represents a planar shape of the termination detecting portion 21 in the surface of the semiconductor substrate 30, and an outer line of the rectangle represents a planar shape of the gate electrode 22 in the surface of the semiconductor substrate 30.

As shown in FIG. 3A, the termination detecting portion 21 is formed to have a rectangular shape in a surface shape thereof. In addition, a plurality of rectangular termination detecting portions 21 are disposed in a matrix so as to surround the MOS type solid-state image pickup element 10 in the scribe line 20 of the semiconductor substrate 30.

Each of the rectangular termination detecting portions 21 is formed in such a way that a longitudinal direction thereof becomes identical to a direction of the scribe line 20 of the semiconductor substrate 30. In other words, each of the rectangular termination detecting portions 21 is formed so as for the longitudinal direction thereof to become parallel with the direction of the scribe line 20 formed in the periphery of the MOS type solid-state image pickup element 10 in the semiconductor substrate 30.

In addition, each two termination detecting portions 21 adjacent to each other in a direction crossing at right angles with the direction of the scribe line 20 are alternately formed in respective positions which are shifted from each other in the direction of the scribe line 20. Referring to FIG. 3A, each two termination detecting portions 21 adjacent to each other in the direction crossing at right angles with the direction of the scribe line 20 are alternately formed so as to be shifted from each other in the direction of the scribe line 20 by about a half of a long side of the termination detecting portion 21.

In addition, the gate electrode 22 is also formed on the corresponding one of the termination detecting portions 21 so as to have a rectangular shape in a surface shape thereof similarly to each of the termination detecting portions 21. Also, the rectangular gate electrode 22 is formed in such a way that a longitudinal direction thereof becomes identical to the direction of the scribe line 20 of the semiconductor substrate 30. In addition, each two gate electrodes 22 adjacent to each other in the direction crossing at right angles with the direction of the scribe line 20 are alternately formed in respective positions which are shifted from each other in the direction of the scribe line 20 by about a half of a long side of the gate electrode 22.

In addition, the termination detecting portions 21, for example, can also be structured so as to have any of arrangements shown in FIGS. 3B and 3C in addition to the arrangement shown in FIG. 3A.

In the arrangement of the termination detecting portions 21 shown in FIG. 3B, in contrast with the arrangement of the termination detecting portions 21 shown in FIG. 3A, each two termination detecting portions 21 adjacent to each other in the direction of the scribe line 20 are formed in respective positions which are shifted from each other in the direction crossing at right angles with the direction of the scribe line 20, i.e., in a so-called width direction of the scribe line 20.

In other words, each two termination detecting portions 21 adjacent to each other in the direction crossing at right angles with the direction of the scribe line 20 are alternately formed in the respective positions which are shifted from each other in the direction of the scribe line 20, and moreover each two termination detecting portions 21 arranged in the direction of the scribe line 20 are formed so as to be shifted in the width direction of the scribe line 20.

As has been described above, in addition to the arrangement in which the termination detecting portions 21 are arranged in a line in the direction of the scribe line 20, each two termination detecting portions 21 arranged in the direction of the scribe line 20 may also be formed so as to be slightly shifted from each other in the width direction of the scribe line 20. However, each two termination detecting portions 21 adjacent to each other in the direction of the scribe line 20 are formed in the respective positions where parts thereof at least overlap each other in the width direction of the scribe line 20.

In addition, in the arrangement of the termination detecting portions 21 shown in FIG. 3C, each two termination detecting portions 21 adjacent to each other in the direction of the scribe line 20 are formed in the respective positions which are shifted from each other in the direction crossing at right angles with the direction of the scribe line 20. Moreover, each two termination detecting portions 21 adjacent to each other in the direction crossing at right angles with the direction of the scribe line 20 are formed in respective positions which are shifted from each other in the direction of the scribe line 20.

In other words, in the arrangement of the termination detecting portions 21 shown in FIG. 3C, the termination detecting portions 21 arranged in the direction of the scribe line 20 are formed in the respective positions which are shifted from each other in the direction crossing at right angles with the direction of the scribe line 20, i.e., in the so-called width direction of the scribe line 20 similarly to the case of the arrangement of the termination detecting portions 21 shown in FIG. 3B.

Moreover, in the arrangement of the termination detecting portions 21 shown in FIG. 3C, all three columns of the termination detecting portions 21 each arranged in a line in the direction of the scribe line 20 are formed in respective positions which are different from one another in the width direction of the scribe line 20. In contrast with the arrangement of the termination detecting portions 21 shown in FIG. 3C, in the arrangement of the termination detecting portions 21 shown in FIG. 3A, the columns of the termination detecting portions 21 each arranged in a line in the direction of the scribe line 20 are alternately formed in the same positions in the width direction of the scribe line 20 every two columns. In other words, in the arrangement of the termination detecting portions 21 shown in FIG. 3C, unlike the arrangement of the termination detecting portions 21 shown in FIG. 3A, the termination detecting portions 21 may not be formed in the same positions in the direction crossing at right angles with the direction of the scribe line 20 every two columns. Therefore, in the arrangement of the termination detecting portions 21 shown in FIG. 3C, the positions where the respective termination detecting portions 21 are formed may be arbitrarily set both in the direction of the scribe line 20 and in the direction crossing at right angles with the direction of the scribe line 20.

At this time, each two termination detecting portions 21 adjacent to one another in the direction of the scribe line 20 are formed in the respective positions where the parts thereof at least overlap one another in the direction of the scribe line 20. Moreover, each two termination detecting portions 21 adjacent to each other in the direction crossing at right angles with the direction of the scribe line 20 are formed in the respective positions where the parts thereof at least overlap each other in the direction crossing at right angles with the direction of the scribe line 20.

For example, when an interval of the scribe lines 20 is set as 5 mm, and a width of the scribe line 20 is set as 100 µm in the semiconductor substrate 30, each of the termination detecting portions 21 shown in FIGS. 3A to 3C, respectively, is formed so that a short side thereof is 0.7 µm, and a long side thereof is 5 µm. In addition, for example, each of the gate electrodes 22 is formed on the respective termination detecting portions 21 in such a way that a short side thereof is 0.9 µm and a long side thereof is 5.2 µm.

In addition, with regard to an interval of the termination detecting portions 21, the termination detecting portions 21 are formed in such a way that an interval of the termination detecting portions 21 in the direction parallel with the direction of the scribe line 20 is 1 µm, and an interval of the termination detecting portions 21 in the direction crossing at right angles with the direction of the scribe line 20 is 0.7 µm. Also, the termination detecting portions 21 are formed in such a way that an interval from an end of the scribe line 20 to the termination detecting portion 21 in the side end of the scribe line 20 is 1.3 µm.

It should be noted that the termination detecting portions 21 and the scribe line 20 can be formed in such a way that an interval of each adjacent two scribe lines 20 is set in the range of 1 to 15 mm, a width of each of the scribe lines 20 is set in the range of 30 to 400 µm, a short side of each of the termination detecting portions 21 is set in the range of 0.1 to 2 µm, and a long side of each of the termination detecting portions 21 is set in the range of 0.2 to 25,000 µm depending on a size of the semiconductor substrate 30, and a size of the MOS type solid-state image pickup element 10, and the like. In addition, each of the gate electrodes 22 can be formed on the respective termination detecting portions 21 in such a way that a short side thereof is set in the range of 0.1 to 2 µm, and a long side thereof is set in the range of 0.1 to 25,000 µm.

In addition, the termination detecting portions 21 can be formed in such a way that each of the interval of the termination detecting portions 21 in the direction parallel with the direction of the scribe line 20, and the interval of the termination detecting portions 21 in the direction crossing at right angles with the direction of the scribe line 20 is set in the range of 0.1 to 400 µm.

It should be noted that although in each of FIGS. 3A to 3C, the shape of the termination detecting portion 21 is shown in the form of the rectangular shape having the longitudinal direction parallel with the scribe line 20 as an example of the termination detecting portion 21, the shape of the termination detecting portion 21 is by no means limited thereto. All it takes is that the termination detecting portion is formed so as to have a square shape having a side parallel with the direction of the scribe line of the semiconductor substrate. For example, the shape of the termination detecting portion is formed so as to have a quadrate having a side parallel with the direction of the scribe line of the semiconductor substrate in addition to the shapes shown in FIGS. 3A to 3C, respectively. In addition, the termination detecting portion may be formed so as to have a rectangular shape in which a longitudinal direction is defined in the direction crossing at right angles with the direction of the scribe line of the semiconductor substrate, i.e., so as to have a rectangular shape in which a longitudinal direction is defined in the direction crossing at right angles with the direction of the scribe line.

Figure 4:
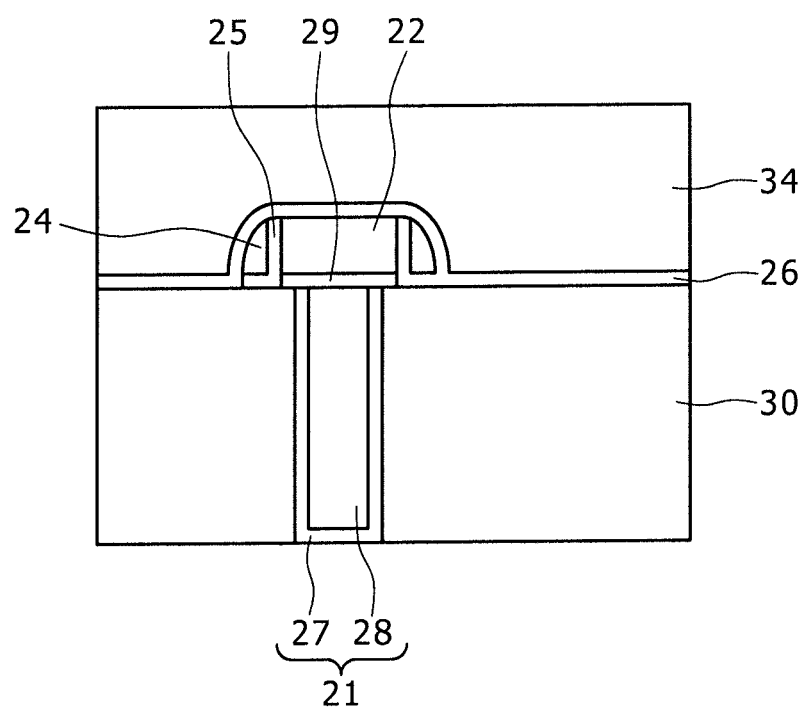
FIG. 4 is a schematic cross sectional view taken on line A-A' of FIG. 3A.

Next, FIG. 4 shows an enlarged cross sectional view taken on line A-A' of FIG. 3A.

As shown in FIG. 4, the termination detecting portion 21, for example, is composed of a first layer 27 and a second layer 28 within a trench of the semiconductor substrate 30. The first layer 27, for example, is formed as an insulating layer between the second layer 28 and the semiconductor substrate 30 when the second layer 28 is made of a conductive material.

The termination detecting portion 21 is made of a material having higher hardness than that of the semiconductor substrate 30 so that removal processing is stopped while one surface side of the semiconductor substrate 30 is removed. For example, the termination detecting portion 21 is made of an insulating material such as a silicon oxide or a silicon nitride, or is made of a conductive material such as polysilicon, P-Doped Amorphous Silicon (PDAS) or a metal when the termination detecting portion 21 is used as the electrode.

It should be noted that the termination detecting portion 21, for example, has a structure made of a single material or a plurality of structures of two layers or more in addition to the two-layer structure as shown in FIG. 4.

The gate electrode 22 is formed on the semiconductor substrate 30 and the termination detecting portion 21 through a gate insulating film 29. Sidewalls 24 and 25 are formed on a side surface of the gate electrode 22. In addition, a passivation layer 26 is formed on the gate electrode 22, and the sidewalls 24 and 25. Also, the interlayer insulating layer 34 is formed on the passivation layer 26.

The gate electrode 22, the sidewalls 24 and 25, the passivation layer 26 and the like are structured so as to correspond to the shape of the gate electrode of the MOS transistor Tr composing the MOS type image pickup element 10. Adoption of the same structure as that of the gate electrode of the MOS transistor results in that the gate electrode 22 can be formed on the termination detecting portion 21 concurrently with the formation of each of the gate electrodes 44 and 45 of the MOS transistors Tr in the process for forming the gate electrodes of the MOS transistors.

As described above, the square-shaped termination detecting portions each having the side parallel with the direction of the scribe line of the semiconductor substrate are formed in the scribe line of the semiconductor substrate.

Moreover, each two square-shaped termination detecting portions are alternately formed in the respective positions which are shifted from each other in the direction of the scribe line. In addition, each two square-shaped termination detecting portions adjacent to each other in the direction of the scribe line are formed in the respective positions which are shifted from each other in the direction crossing at right angles with the direction of the scribe line. In addition, each two square-shaped termination detecting portions adjacent to each other in the direction of the scribe line are formed in the respective positions which are shifted from each other in the direction crossing at right angles with the direction of the scribe line, and each two square-shaped termination detecting portions adjacent to each other in the direction crossing at right angles with the direction of the scribe line are formed in the respective positions which are shifted from each other in the direction of the scribe line.

The provision of the termination detecting portions structured as described above in the semiconductor substrate results in that in the semiconductor substrate thinly shaved as with the back surface radiation type solid-state image pickup element, it is possible to suppress the generation of the crack or the like of the semiconductor substrate during the scribing process for cutting the semiconductor substrate into the pieces of MOS type solid-state image pickup elements. Therefore, it is possible to suppress the reduction of the manufacture yield caused by the crack or the like of the semiconductor substrate.

In particular, the rectangular termination detecting portions each having the longitudinal direction identical to the direction of the scribe line are formed in the scribe line of the semiconductor substrate. Moreover, each two rectangular termination detecting portions adjacent to each other in the direction crossing at right angles with the direction of the scribe line are alternately formed in the respective positions which are shifted from each other in the direction of the scribe line. In addition, each two rectangular termination detecting portions adjacent to each other in the direction of the scribe line are formed in the respective positions which are shifted from each other in the direction crossing at right angles with the direction of the scribe line, and each two rectangular termination detecting portions adjacent to each other in the direction crossing at right angles with the direction of the scribe line are formed in the respective positions which are shifted from each other in the direction of the scribe line. The termination detecting portions are structured as described above, which results in that it is possible to further suppress the generation of the crack or the like of the semiconductor substrate during the scribing process for cutting the semiconductor substrate into the pieces of MOS type solid-state image pickup elements. Therefore, it is possible to suppress the reduction of the manufacture yield caused by the crack or the like of the semiconductor substrate.

In addition, the termination detecting portions described above are formed in the scribe line, which does not exert an influence on the area of the regions or the like in which the pixel portion, the photoelectric conversion portions, and the MOS transistors of the MOS type solid-state image pickup element are to be formed. For this reason, the sufficient area can be ensured in the pixel portion, and thus the sensitivity of the MOS type solid-state image pickup element can be increased. In addition, even when the termination detecting portions are formed in the semiconductor substrate, the degree of freedom of the MOS type solid-state image pickup element is not reduced.

Moreover, the termination detecting portions are formed in the form of an alignment mark in the processes for manufacturing the MOS type solid-state image pickup element, whereby the termination detecting portions can be formed in the process for forming the alignment mark in the existing semiconductor device. In addition, the gate electrodes can be formed on the respective termination detecting portions in the same process as that for the gate electrodes of the respective MOS transistors composing the MOS type solid-state image pickup element.

For this reason, the termination detecting portions structured as described above can be formed without increasing the number of processes for manufacturing the existing semiconductor device.

It is noted that the crack or the like caused by the scribe of the semiconductor substrate 30 can be prevented as the number of termination detecting portions 21 formed in the scribe line 20 is larger. For this reason, preferably, the termination detecting portions 21 are densely formed over the entire surface of the scribe line 20.

2. Method of Manufacturing MOS Type Solid-State Image Pickup Element

Next, a description will be given with respect to a method of manufacturing the MOS type solid-state image pickup element according to another embodiment of the present invention.

Figure 5A:
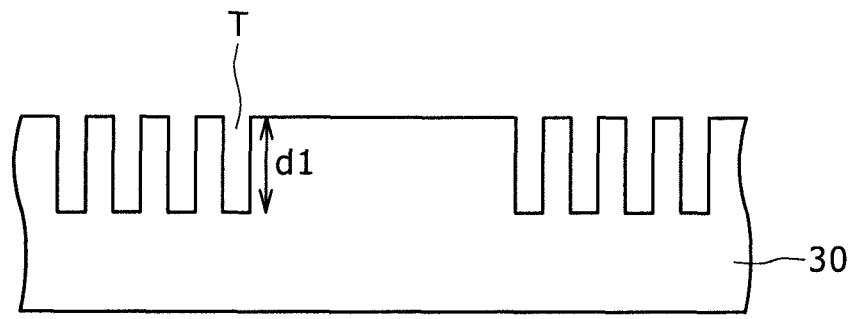
FIGS. 5A to 5I are respectively cross sectional views showing respective processes in a method of manufacturing the MOS type solid-state image pickup element shown in FIG. 2 according to another embodiment of the present invention.
Figure 5B:
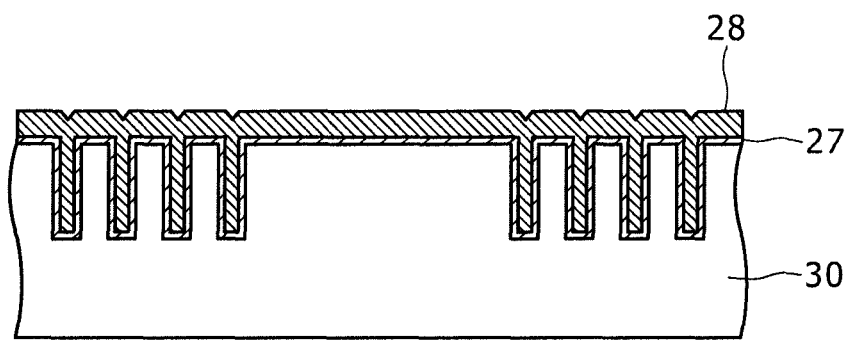
Figure 5C:
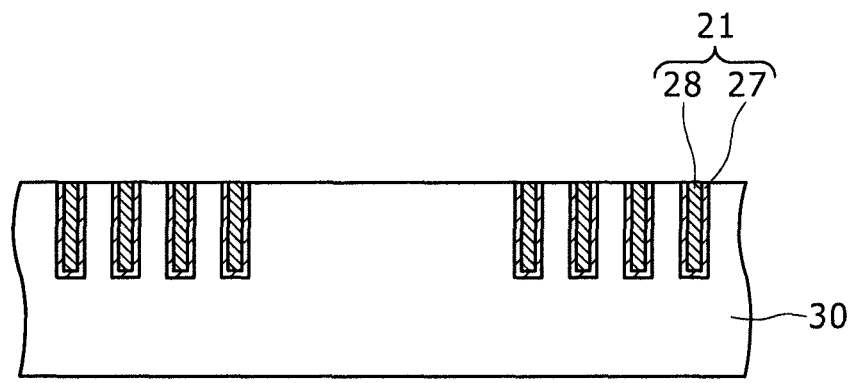

Firstly, as shown in FIG. 5A, the semiconductor substrate (such as a silicon wafer) 30 is prepared. Also, trenches T for formation of the square-shaped termination detecting portions 21 are formed in the region becoming the scribe line 20 of the semiconductor substrate 30. Also, as shown in FIG. 5B, after completion of the formation of the trenches T, the first layer 27 is formed by, for example, utilizing a CVD method or the like so as to cover each of inner wall surfaces of the trenches T and the surface of the semiconductor substrate 30. In addition, the second layer 28 is formed by, for example, utilizing the CVD method or the like so as to be filled in each of the trenches T. Also, as shown in FIG. 5C, etch back is carried out for the first layer 27 and the second layer 28, so that the first layer 27 and the second layer 28 are left only in each of the trenches T. The termination detecting portions 21 each having the two-layer structure including the first layer 27 and the second layer 28 are formed in this process.

Each of the trenches T is formed at the same depth as that (the depth from the surface of the semiconductor substrate 30) of the photodiode PD becoming the photoelectric conversion element which will be finally formed. That is to say, the length, dl, in the depth direction of each of the termination detecting portions 21 formed in the respective trenches T becomes a length corresponding to the thickness of the photodiode PD.

Each of the termination detecting portions 21 is made of the material having the higher hardness than that of the semiconductor substrate 30. In addition, the first layer 27 is made of the insulating material such as the silicon oxide or the silicon nitride, and the second layer 28 is made of the conductive material such as polysilicon, P-Doped Amorphous Silicon (PDAS) or the metal.

In addition, in the processes for forming the termination detecting portions 21 shown in FIGS. 5A to 5C, the trenches T are disposed in the manner as shown in FIG. 3A, 3B or 3C. Also, the trench T is formed so as to have the following shape so as to correspond to the shape of the termination detecting portion 21. That is to say, the trench T is formed in such a way that the shape thereof on the surface of the semiconductor substrate 30 is the square shape so as to have the side parallel with the direction of the scribe line 20 of the semiconductor substrate 30.

At this time, when, for example, the termination detecting portion 21 is formed so as to have the rectangular shape in which the longitudinal direction thereof is identical to the direction of the scribe line 20 of the semiconductor substrate 30, the trench T is formed in such a way that the shape thereof in the surface of the semiconductor substrate 30 is the square shape, and the longitudinal direction thereof becomes identical to the direction of the scribe line 20 of the semiconductor substrate 30.

In addition, although in FIGS. 5A to 5C, the termination detecting portion 21 is formed so as to have the two-layer structure, for example, the termination detecting portion can also be formed so as to have the a single-layer structure by filling a single material in the trench T. In addition, the termination detecting portion can also be formed so as to have a multi-layer structure by filling a plurality of materials in the trench T.

It should be noted that although in the following description and the figures used in the following description, the termination detecting portion 21 is shown as if the termination detecting portion 21 has the single-layer structure for the sake of simplicity, as described above, the termination detecting portion 21 may also be structured so as to have a plurality of layers.

Figure 5D:
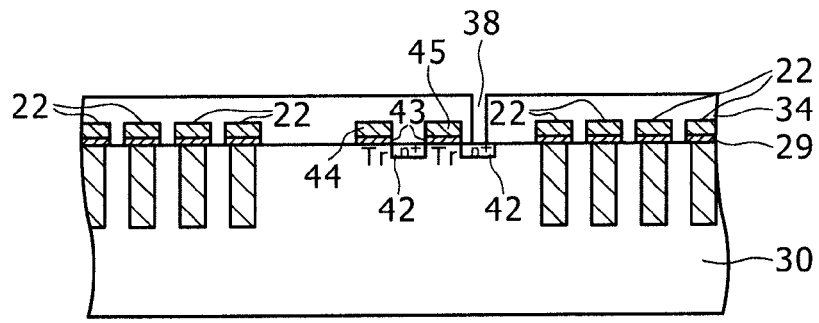

Next, as shown in FIG. 5D, a plurality of MOS transistors Tr for reading out the signal charges from the photodiode PD, which will be formed later, in each of unit pixel areas 23 of the semiconductor substrate 30 between the adjacent two scribe lines 20 each having the termination detecting portions 21 formed therein. A plurality of MOS transistors Tr are formed on the surface side of the semiconductor substrate 30.

A plurality of MOS transistors Tr are structured in various numbers, and, for example, can be composed of four transistors of the charge reading transistor, the reset transistor, the amplification transistor, and the vertical selection transistor.

With regard to a plurality of MOS transistors Tr, the charge reading transistor is composed of the photodiode PD, the source and drain regions 42, and the gate electrode 44 between the source and drain regions 42 in one pair. Also, the other transistor is composed of the other pair of source and drain regions 42, and the gate electrode 45 between the source and drain regions 42 in the other pair. After completion of the formation of the photodiode PD, and the MOS transistors Tr, the interlayer insulating layer 34 is formed, and the contact hole 38 is formed in the predetermined region, for example, in the position corresponding to the source and drain regions 42, the gate electrodes 44 and 45, and the like.

In addition, the gate electrodes 22 each having the same structure as that of each of the gate electrodes 44 and 45 of the MOS transistors Tr are formed on the respective termination detecting portions 21 concurrently with the formation of gate electrodes 44 and 45 of a plurality of MOS transistors Tr. It is noted that the gate electrodes 44 and 45 of a plurality of MOS transistors Tr, and the gate electrodes 22 on the respective termination detecting portions 21 are formed through the gate insulating films 29 and 43 on the semiconductor substrate 30, respectively. Moreover, the sidewalls and the passivation layer (each not shown) are formed on the gate electrodes 44 and 45, and the gate electrodes 22.

In addition, each of the gate electrodes 22 formed on the respective termination detecting portions 21 through the respective gate insulating films 29 is also formed so as to have the same square shape as the shape in the surface of the semiconductor substrate 30 in the corresponding one of the termination detecting portions 21 described above. In addition, each of the gate electrodes 22 is formed so that the side of the square shape thereof becomes parallel with the direction of the scribe line 20 of the semiconductor substrate 30.

Also, each of the gate electrodes 22 is formed so that the area thereof becomes larger than that of the corresponding one of the termination detecting portions 21 on the corresponding one of the termination detecting portions 21.

In addition, when, for example, the termination detecting portion 21 is formed so as to have the rectangular shape in which the longitudinal direction thereof is identical to the direction of the scribe line 20 of the semiconductor substrate, the gate electrode 22 is also formed so as to have the rectangular shape in the surface of the semiconductor substrate 30. Also, the gate electrode 22 is also formed so as to have the rectangular shape in which the longitudinal direction thereof is identical to the direction of the scribe line 20 of the semiconductor substrate 30.

In addition, the gate electrode 22 is formed on the termination detecting portion 21 in such a way that the area thereof becomes larger than that of the termination detecting portion 21.

Figure 5E:
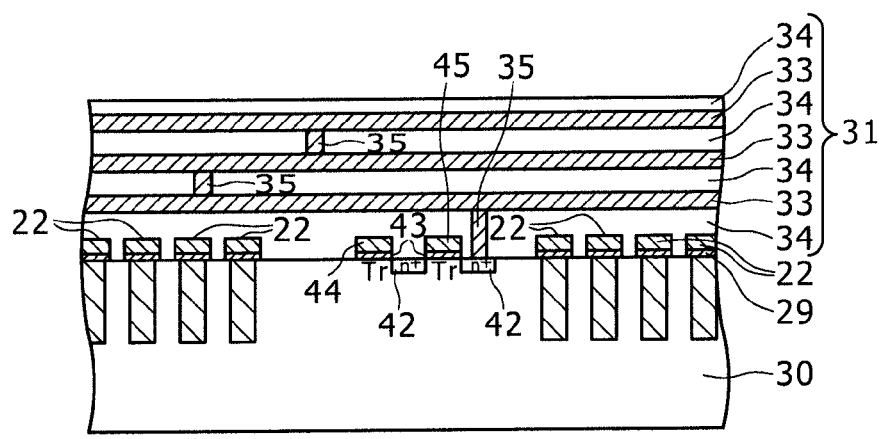

Next, as shown in FIG. 5E, the wiring layers 33 connected to the desired region, the insulating layers 34, and the contact plugs 35 extending completely through the respective insulating layers 34 to connect the wiring layers 33 to one another are formed, thereby forming the multi-layer interconnection layer 31.

Figure 5F:
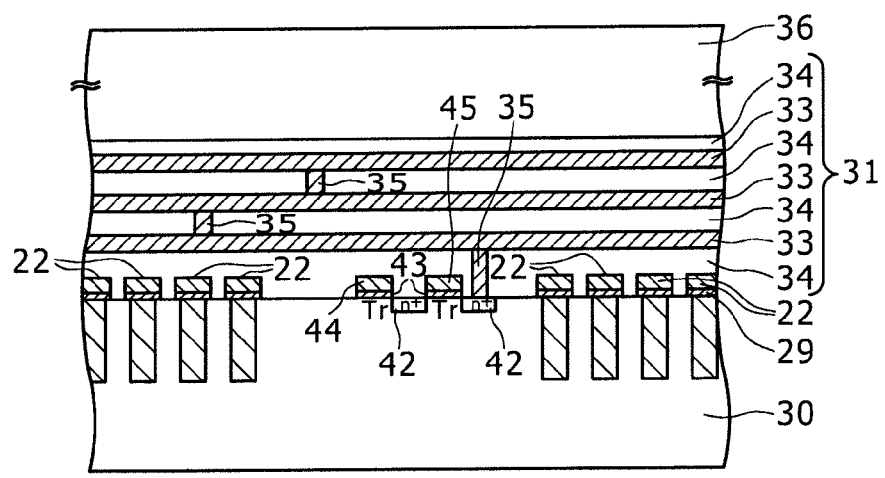

Next, as shown in FIG. 5F, the supporting substrate 36 such as the silicon substrate is stuck onto the multi-layer interconnection layer 31. At this time, the semiconductor substrate 30 and the supporting substrate 33 are aligned with each other by using the termination detecting portions 21 formed in the scribe line 20 as the alignment mark.

Figure 5G:
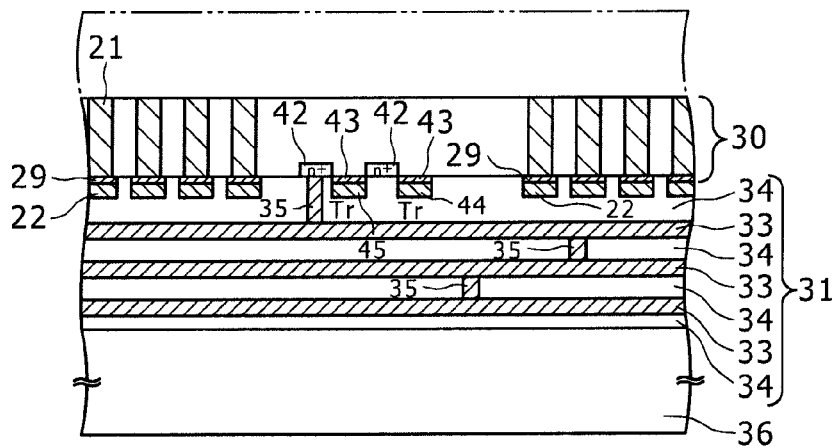

Next, as shown in FIG. 5G, the semiconductor substrate 30 is reversed, and the back surface side of the semiconductor substrate 30 is polished by utilizing the CMP method, thereby thinly processing the semiconductor substrate 30. At this time, since each of the termination detecting portions 21 is made of the material having the higher hardness than that of the semiconductor substrate 30, the chemical mechanical polishing is stopped in the self-aligned manner in the position where each of the bottom surfaces of the termination detecting portions 21 is exposed.

As described above, since the hardness of each of the termination detecting portions 21 is high, each of the bottom surfaces of the termination detecting portions 21 exposed by the chemical mechanical polishing carried out for the back surface of the semiconductor substrate 30 serves as a stopper. As a result, the semiconductor substrate 30 is not polished any more, and thus the polished surface of the semiconductor substrate 30 appears in the self-aligned manner.

Figure 5H:
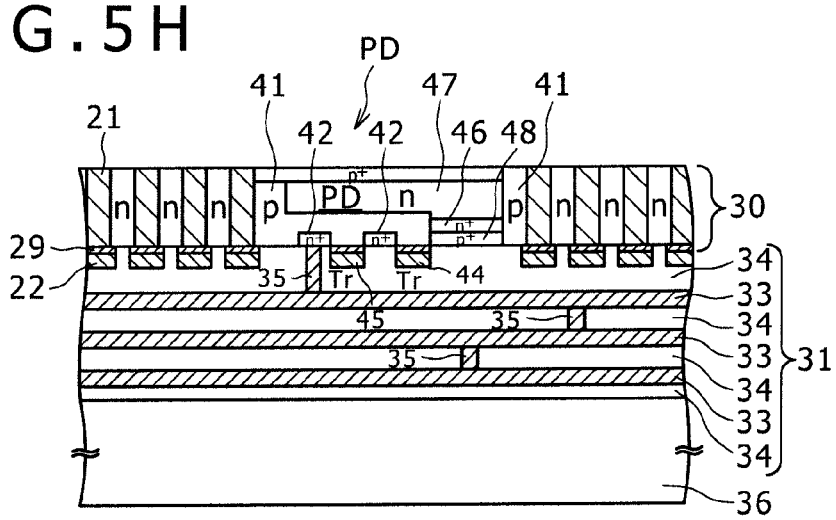

Next, as shown in FIG. 5H, ion implantation is carried out for the back surface of the semiconductor substrate 30, thereby forming the photodiode PD in the semiconductor substrate 30. Here, the photodiode PD is formed at the same depth as the depth, dl, of the isolation region composed of the gate electrodes 22.

For the formation of the photodiode PD, for example, the p-type well region 41 composed of the semiconductor region of the first conductivity type is formed in the (n-type) semiconductor substrate 30 of the second conductivity type. Moreover, there are formed a plurality of MOS transistors Tr composed of the source and drain regions 42 each composed of the ($n^+$-type) semiconductor region of the second conductivity type having the higher impurity concentration than that of the p-type well region 41, the gate insulating films 43, and the gate electrode 44. Also, a (n-type) semiconductor region 46 of the second conductivity type is formed between both the principal surfaces of the semiconductor substrate 30 so as to extend up to the p-type well region 41 of the first conductivity type having a plurality of MOS transistors Tr formed therein, thereby structuring the photodiode PD.

The ($n^+$-type) charge accumulation region 48 of the second conductivity type having the high impurity concentration is formed in the (n-type) semiconductor region 46 of the second conductivity type. Also, the accumulation layer 49 composed of the ($p^+$-type) semiconductor region of the first conductivity type having the high impurity concentration and serving to suppress generation of the dark current is formed so as to contact the charge accumulation region 48. In this case, the accumulation layer 49 composed of a ($p^+$-type) semiconductor region of the first conductivity type having the high impurity concentration and serving to suppress the generation of the dark current is formed on the light incidence surface side of the photodiode PD.

It is noted that the photodiode PD can also be formed by carrying out the ion implantation for the front surface side of the semiconductor substrate 30 in the process described with reference to FIG. 5D.

Figure 5I:
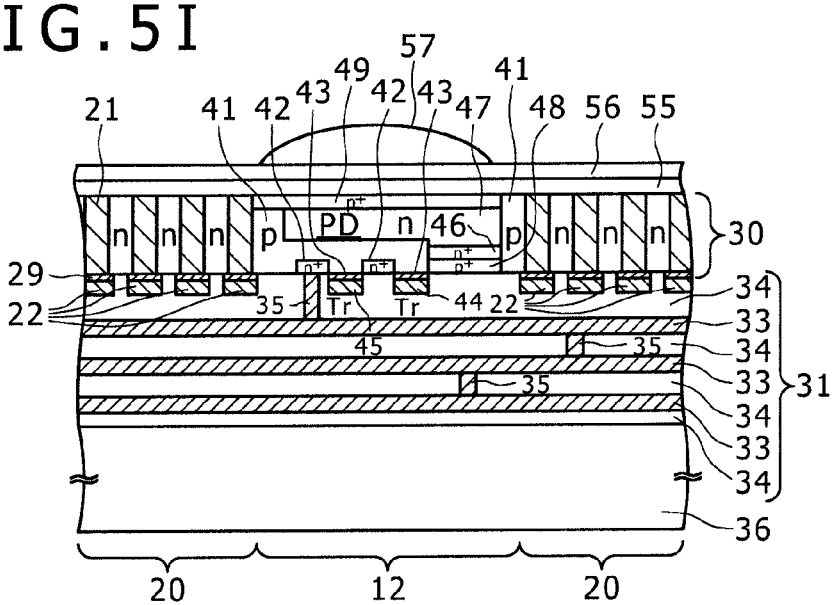

Moreover, as shown in FIG. 5I, the passivation layer 55 is formed on the surface of the semiconductor substrate 30, and the color filter 56 and the on-chip lens 57 are formed in this order on the passivation layer 55.

The back surface radiation type MOS solid-state image pickup element can be manufactured in the processes described above.

With the manufacturing method described above, the termination detecting portions are formed in the scribe line, whereby while the semiconductor substrate is thinly processed by utilizing the CMP method, the CMP is stopped in the self-aligned manner in the position where each of the bottom surfaces of the termination detecting portions is exposed.

Moreover, the termination detecting portions structured as described above are formed in the scribe line of the semiconductor substrate, whereby the generation of the crack or the like of the semiconductor substrate can be suppressed in the process such as the scribing process for cutting the semiconductor substrate into the pieces of MOS type solid-state image pickup elements after the semiconductor substrate is thinly processed. Therefore, it is possible to suppress the reduction of the manufacture yield caused by the crack or the like of the semiconductor substrate.

In addition, the termination detecting portions are formed in the scribe line, which does not exert an influence on the area of the regions or the like in which the pixel portion and the MOS transistors of the MOS type solid-state image pickup element are to be formed. Moreover, the termination detecting portions are formed in the form of the alignment mark in the processes for manufacturing the MOS type solid-state image pickup element, whereby the termination detecting portions can be formed in the process for forming the alignment mark in the existing semiconductor device.

Moreover, each of the gate electrodes 22 formed on the respective termination detecting portions 21 has the same structure as that of each of the gate electrodes 44 and 45 composing the MOS transistors Tr of the MOS type solid-state image pickup element 10. As a result, the gate electrodes 22 can be formed on the respective termination detecting portions 21 concurrently with the formation of the gate electrodes 44 and 45 of the MOS transistors Tr in the processes for forming the gate electrodes 44 and 45 of the MOS transistors Tr. For this reason, the termination detecting portions structured as described above can be formed without increasing the number of processes for manufacturing the existing semiconductor device.

3. Electronic Apparatus

The solid-state image pickup element of the embodiments of the present invention can be applied to an electronic apparatus such as a camera including a solid-state image pickup element, a mobile apparatus with a camera, or other apparatuses each including a solid-state image pickup element.

Figure 6:
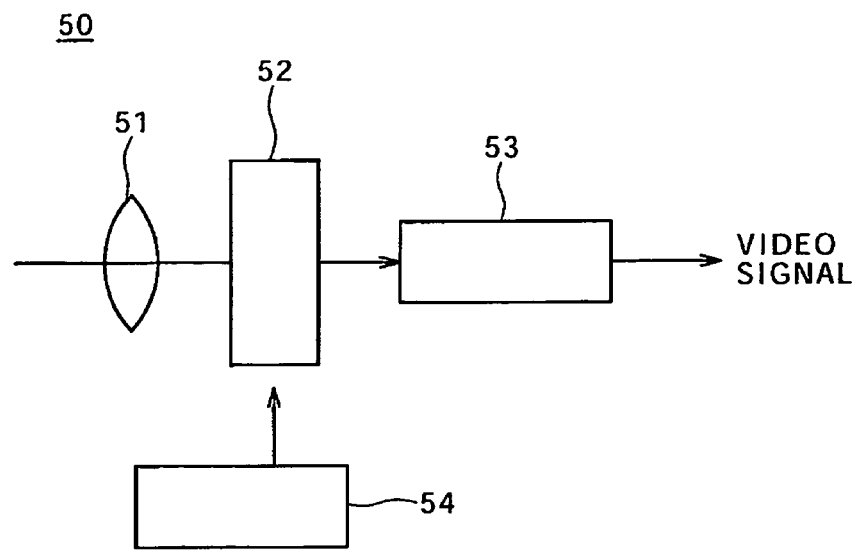
FIG. 6 is a schematic diagram showing a configuration of an electronic apparatus according to still another embodiment of the present invention.
Figure 7:
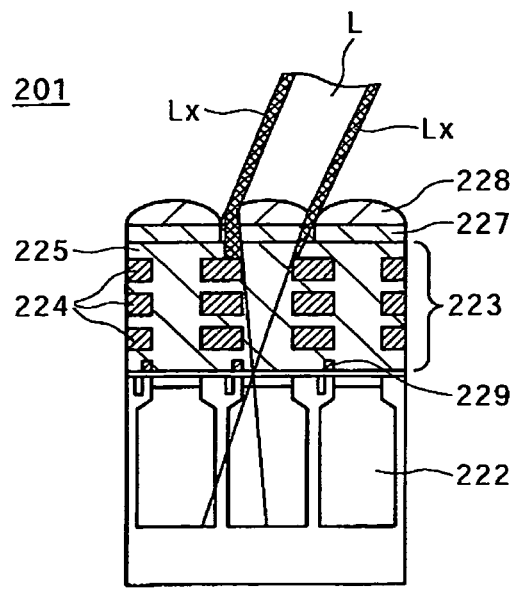
FIG. 7 is a schematic cross sectional view of an existing solid-state image pickup element having a surface radiation type structure.
Figure 8:
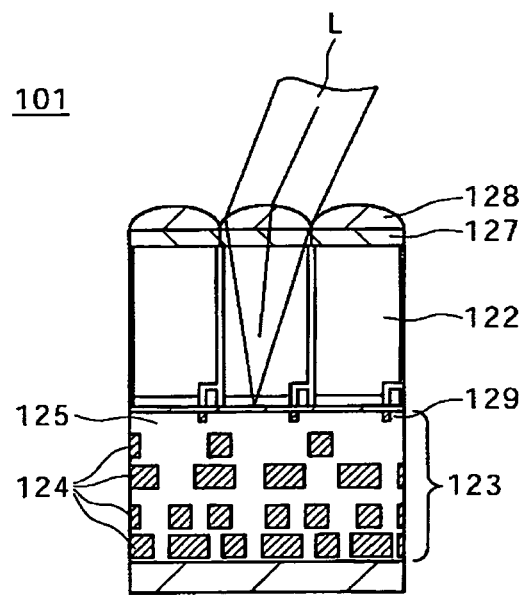
FIG. 8 is a schematic cross sectional view of an existing solid-state image pickup element having a back surface radiation type structure.

FIG. 6 shows a schematic configuration of a digital still camera which is capable of capturing a still image, and to which the solid-state image pickup element according to the embodiment of the present invention is applied.

A digital still camera 50 according to an embodiment of the present invention includes an optical system (optical lens) 51, a solid-state image pickup element 52, a signal processing circuit 53, and a drive circuit 54.

The MOS type solid-state image pickup element 10 previously described is applied to the solid-state image pickup element 52. The optical lens 51 images an image light (incident light) from a subject on an imaging area of the MOS type solid-state image pickup element 52. As a result, signal charges are accumulated for a given period of time in the respective photoelectric conversion elements in the MOS type solid-state image pickup element 52. The drive circuit 54 supplies a transfer operation signal to the MOS type solid-state image pickup element 52. The signal transfer is carried out in the MOS type solid-state image pickup element 52 in accordance with a drive signal (timing signal) supplied from the drive circuit 54. The signal processing circuit 53 executes various kinds of signal processing for an output signal from the MOS type solid-state image pickup element 52. A video signal obtained through the various kinds of signal processing is either stored in a recording medium such as a memory, or is outputted to a monitor or the like. The digital still camera 50 of the embodiment includes forms of a camera module into which the optical lens 51, the MOS type solid-state image pickup element 52, the signal processing circuit 53, and the drive circuit 54 are modularized.

According to the embodiments of the present invention, it is possible to configure a mobile apparatus with a camera, for example, typified by a mobile phone including the digital still camera 50 shown in FIG. 6, or the camera module.

Moreover, the digital still camera 50 shown in FIG. 6 can be configured in the form of a module which has an image capturing function, and into which the optical lens 51, the MOS type solid-state image pickup element 52, the signal processing circuit 53, and the drive circuit 54 are modularized, i.e., a so-called image capturing functional module. According to the embodiments of the present invention, it is possible to configure an electronic apparatus including such an image capturing functional module.

It should be noted that in the MOS type image pickup element described above, the FD region of the second conductivity type, and the PD regions of the second conductivity type and the first conductivity type are formed in the p-type semiconductor region of, for example, the first conductivity type formed in the n-type semiconductor substrate of, for example, the second conductivity type, the n-type conductivity type and the p-type conductivity type may be reversed.

It should be noted that the present invention is by no means limited to the constitutions described above in the above embodiments, and thus various changes and modifications thereof can be made without departing from the gist of the present invention.

The present application contains subject matter related to that disclosed in Japanese Priority Patent Application JP 2009-054212 filed in the Japan Patent Office on Mar. 6, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state image pickup element, comprising:
    a plurality of pixels each having a photoelectric conversion portion for converting a quantity of incident light into an electric signal, and a plurality of pixel transistors;
    wiring layers formed on one surface side of a semiconductor substrate having said plurality of pixels formed therein, light made incident from a side opposite to the one surface having said wiring layers formed thereon being received by corresponding one of the photoelectric conversion portions;
    a scribe line region in a periphery of a pixel portion composed of said plurality of pixels; and
    square-shaped termination detecting portions for determining a polishing termination, each having higher hardness than that of said semiconductor substrate and formed in the scribe line region, and at least a portion of the termination detecting portions being formed at a same depth in the substrate as the photoelectric conversion portions and having a top surface exposed by polishing such that the top surface of the square-shaped termination detecting portions is at a same level as a surface of the substrate;
    wherein each of said square-shaped termination detecting portions has a side parallel with a direction of said scribe line of said semiconductor substrate.

2. The solid-state image pickup element according to claim 1, wherein each of said termination detecting portions is formed so as to have a rectangular shape in which a longitudinal direction thereof is identical to a direction of said scribe line of said semiconductor substrate or crosses at right angles with the direction of said scribe line of said semiconductor substrate.

3. The solid-state image pickup element according to claim 1, wherein each two square-shaped termination detecting portions adjacent to each other in the direction crossing at right angles with the direction of said scribe line are formed in respective positions which are shifted from each other in the direction of said scribe line.

4. The solid-state image pickup element according to claim 1, wherein each two square-shaped termination detecting portions adjacent to each other in the direction of said scribe line are formed in respective positions which are shifted from each other in the direction crossing at right angles with the direction of said scribe line, and each two square-shaped termination detecting portions adjacent to each other in the direction crossing at right angles with the direction of said scribe line are alternately formed in respective positions which are shifted from each other in the direction of said scribe line.

5. The solid-state image pickup element according to claim 1, wherein each two square-shaped termination detecting portions adjacent to each other in the direction of said scribe line are formed in respective positions which are shifted from each other in the direction crossing at right angles with the direction of said scribe line, and each two square-shaped termination detecting portions adjacent to each other in the direction crossing at right angles with the direction of said scribe line are formed in respective positions which are shifted from each other in the direction of said scribe line.

6. The solid-state image pickup element according to claim 1, wherein each of said termination detecting portions is formed so as to have a multi-layer structure made of an insulating material and a conductive material.

7. The solid-state image pickup element according to claim 1, wherein gate electrodes are formed on said termination detecting portions, respectively.

8. The solid-state image pickup element according to claim 7, wherein each of said gate electrodes is formed on said semiconductor substrate so as to have a larger area than that of corresponding one of said termination detecting portions.

9. The solid-state image pickup element according to claim 8, wherein each of said gate electrodes formed on said termination detecting portions, respectively, has the same structure as that of each of gate electrodes of said plurality of pixel transistors.

10. An electronic apparatus, comprising:
a solid-state image pickup element including a plurality of pixels each having a photoelectric conversion portion for converting a quantity of incident light into an electric signal, and a plurality of pixel transistors; wiring layers formed on one surface side of a semiconductor substrate having said plurality of pixels formed therein, a light made incident from a side opposite to the one surface having said wiring layers formed thereon being received by corresponding one of the photoelectric conversion portions; a scribe line region formed in a periphery of a pixel portion composed of said plurality of pixels; and square-shaped termination detecting portions for determining a polishing termination and each having higher hardness than that of said semiconductor substrate and formed in said scribe line region, and at least a portion of the termination detecting portions being formed at a same depth in the substrate as the photoelectric conversion portions and having a top surface exposed by polishing such that the top surface of the square-shaped termination detecting portions is at a same level as a surface of the substrate, each of said square-shaped termination detecting portions having a side parallel with a direction of said scribe line of said semiconductor substrate;
an optical system for guiding the incident light to an image pickup portion of said solid-state image pickup element; and
a signal processing circuit for processing an output signal from said solid-state image pickup element.

* * * * *